(12) United States Patent
Son et al.

(10) Patent No.: US 7,289,373 B1
(45) Date of Patent: Oct. 30, 2007

(54) HIGH PERFORMANCE MEMORY DEVICE

(75) Inventors: Moon-Hae Son, San Jose, CA (US); Karl Lin Wang, Los Altos, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 11/447,292

(22) Filed: Jun. 6, 2006

(51) Int. Cl.
*G11C 7/00* (2006.01)

(52) U.S. Cl. .................. 365/189.02; 365/203; 365/207

(58) Field of Classification Search ................ 365/196, 365/204
See application file for complete search history.

(56) References Cited

U.S. PATENT DOCUMENTS

| | | | | |
|---|---|---|---|---|
| 5,036,494 | A * | 7/1991 | Wise et al. | 365/230.03 |
| 6,249,482 | B1 * | 6/2001 | Albon et al. | 365/233 |
| 6,282,136 | B1 | 8/2001 | Sakurai et al. | |
| 6,407,961 | B1 * | 6/2002 | Perets et al. | 365/230.04 |
| 7,116,585 | B2 * | 10/2006 | Vernenker et al. | 365/189.05 |

OTHER PUBLICATIONS

H. Kabuo et al. "An 80-MOPS-Peak High-Speed and Low-Power Consumption 16-b Digital Signal Processor" *IEEE Journal of Solid State Circuits*, vol. 31, No. 4, Apr. 1996, pp. 494-502.

* cited by examiner

*Primary Examiner*—Tan T. Nguyen
(74) *Attorney, Agent, or Firm*—Nixon & Vanderhye P.C.

(57) ABSTRACT

A memory device is provided comprising a memory array consisting of a plurality of memory cells. These memory cells are accessed via a plurality of word lines and a plurality of bit lines. Multiplexer logic is provided which has the plurality of bit lines connected to its inputs, and is arranged to connect one of those inputs to its output dependent on a multiplexer control signal. Decoder logic is responsive to an address to produce the multiplexer control signal and to select one of the word lines, as a result of which a particular memory cell in the memory array identified by the address has its associated bit line connected to the output of a multiplexer logic. Sense amp logic is coupled to the output of the multiplexer logic and has a precharge node used during a sensing operation to detect a stored data state of the particular memory cell. Control logic initiates the sensing operation and causes the precharge node of the sense amp and at least the bit line associated with the particular memory cell to be precharged in a precharge operation prior to the sensing operation. Further, isolation logic is provided between the output of the multiplexer logic and the precharge node of the sense amp logic to isolate the precharge node from the capacitance of the output of the multiplexer logic during the sensing operation.

10 Claims, 9 Drawing Sheets

HIGH PERFORMANCE MEMORY DEVICE

BACKGROUND OF THE INVENTION

1. Field of the Invention

The present invention relates to a high performance memory device, and in particular to semiconductor memory devices, for example Read Only Memory (ROM) devices, Flash devices, etc.

2. Description of the Prior Art

In such memory devices, a memory array is provided having a plurality of memory cells. Typically, the memory cells are arranged into a number of rows and columns, with the memory cells in a particular row being connected to a word line, and the memory cells in a particular column being connected to a bit line. To read the data state stored within a particular memory cell, the relevant word line is selected in order to turn on the relevant memory cell, and then the signal on the relevant bit line is monitored in order to detect the stored data state.

In one known prior art memory device, the bit lines are precharged prior to performing such a read operation. Thereafter, during the read operation, a particular memory cell identified by an address is accessed by selecting the appropriate word line and the appropriate bit line, and if the voltage on the selected bit line does not discharge, this indicates that a first data state is stored in the memory cell (for example a logic one level), whereas if the voltage on the selected bit line discharges, this indicates that a second data state is stored in the memory cell (for example a logic zero level).

Generally there is a continuing desire to make memory devices smaller and smaller, and as a result the sizes of the individual memory cells are becoming smaller and smaller. As the size of the memory cells decreases, the amount of leakage current from those memory cells increases, which leads to undesirable power consumption. With the aim of seeking to reduce such power consumption, it is known to provide techniques for selectively precharging only a subset of the bit lines, ideally only the bit line that is associated with the memory cell to be addressed, thereby avoiding leakage current that would occur through memory cells connected to other bit lines that are not of interest for the particular read operation to follow.

U.S. Pat. No. 6,282,136 describes one such selective pre-charge technique. FIG. 1 of the present application illustrates a memory device according to the teaching of U.S. Pat. No. 6,282,136. The memory array 40 consists of a plurality of memory cells 42, 44, . . . , 56, 58, which are arranged in a series of rows and columns. The program counter 10 transmits address signals to the memory device, and in particular sends address signals to the X-decoder 15 and the Y-decoder 20. The X-decoder selects a particular word line based on the received address. The Y-decoder 20 selects one of the pass transistors 32, 34, 36 within multiplexer logic 30 based on the address received from the program counter 10, thereby connecting one of the bit lines to the output circuit 60. The precharge transistor 64 is arranged to receive an inverted clock signal via the inverter 62, such that when the clock signal is high, the precharge transistor 64 turns on and precharges the bit line selected by the Y-decoder 20 via the multiplexer logic 30. Since the X-decoder 15 is driven by an inverted version of the clock signal, it only activates the relevant word line once the clock signal has gone low, by which time the required bit line will have been precharged by the precharge transistor 64.

U.S. Pat. No. 6,282,136 discusses the particular problem of ensuring that the address is decoded quickly enough to enable the relevant pass transistor in the multiplexer 30 to be turned on prior to the precharging operation taking place. With the aim of seeking to address this issue, the technique described in U.S. Pat. No. 6,282,136 sends the low order bit signals of the address to the X-decoder 15 and the upper order bit signals of the address to the Y-decoder 20. The memory array is arranged such that only the upper bits of the address are required by the Y-decoder 20 in order to choose the appropriate pass transistor 32, 34, 36, and accordingly there is sufficient time while the clock signal is high for the Y-decoder 20 to determine the appropriate pass transistor to turn on, and for that pass transistor to be turned on before the precharge transistor 64 is turned on to precharge the selected bit line, thereby avoiding a need to precharge any unnecessary bit lines, and hence reducing power consumption within the memory device.

Whilst such a technique can reduce power consumption, as the memory device is increased in size the capacitance exhibited by the multiplexer logic 30 increases, and this can significantly affect the speed with which the output circuit 60 can detect the stored data state within the addressed memory cell.

The Article "An 80-MOPS-Peak High-Speed and Low-Power Consumption 16-b Digital Signal Processor" by Hideyuki Kabuo et al., Pages 494 to 502, IEEE Journal of Solid State Circuits, Vol. 31, No. 4, April 1996, describes a digital signal processor (DSP), and on page 499 describes the data ROM used within that DSP. In a similar manner to that discussed earlier with reference to U.S. Pat. No. 6,282,136, this article describes with reference to FIG. 9 therein a technique whereby a particular bit line can be precharged prior to performing a read operation on the required memory cell, in accordance with the technique described therein a sense amplifier being used to detect the stored state in the addressed memory cell by monitoring the voltage on the selected bit line during the read operation. Whilst the use of sense amplifiers can provide an efficient technique for detecting the stored data state within the addressed memory cell, the speed of operation of the sense amplifier logic is significantly adversely affected by the capacitance of the multiplexer logic to which the sense amplifier logic is connected.

Accordingly, it would be desirable to provide a technique for improving the performance of reading a stored data state of memory cells within a memory device that uses precharging techniques to reduce power consumption.

SUMMARY OF THE INVENTION

Viewed from a first aspect, the present invention provides a memory device comprising: a memory array having a plurality of memory cells; a plurality of word lines and a plurality of bit lines via which the plurality of memory cells are accessed; multiplexer logic having a plurality of inputs and an output, each input connected to one of said plurality of bit lines, and said output being connected to one of said inputs dependent on a multiplexer control signal; decoder logic, responsive to an address, for producing said multiplexer control signal and for selecting one of said word lines, whereby a particular memory cell in said memory array identified by the address has its associated bit line connected to said output of the multiplexer logic; sense amp logic coupled to said output of the multiplexer logic and having a precharge node used during a sensing operation to detect a stored data state of said particular memory cell; control logic for initiating the sensing operation and for causing the precharge node of the sense amp and at least the bit line associated with the particular memory cell to be precharged in a precharge operation prior to said sensing operation; and isolation logic provided between said output of the multiplexer logic and said precharge node of the sense amp logic to isolate said precharge node from the capacitance of said output of the multiplexer logic during said sensing operation.

In accordance with the present invention, sense amp logic is provided which is coupled to the output of multiplexer logic used to select a particular bit line, the sense amp logic having a precharge node used during a sensing operation to detect a stored data state of an addressed memory cell. Control logic is used to cause the precharge node of the sense amp and at least the bit line associated with the addressed memory cell to be precharged in a precharge operation prior to the sensing operation. Further, isolation logic is provided between the output of the multiplexer and the precharge node of the sense amp logic to isolate the precharge node from the capacitance of the output of the multiplexer. As a result, the speed of operation of the sense amp logic is significantly improved, thereby significantly improving the speed of operation of the memory device, whilst still enabling the power consumption benefits of using precharge operations to be achieved. Accordingly, a high performance, lower power consumption, memory device can be achieved when employing the present invention.

The isolation logic can take a variety of forms, provided that it serves the purpose of isolating the precharge node of the sense amp logic from the capacitance of the multiplexer's output. However, in one embodiment, the isolation logic comprises a transistor, a voltage applied to the gate of the transistor being such that, when the bit line associated with the particular memory cell reaches its precharged state, the transistor turns off. During the sensing operation, if a voltage on the bit line associated with the particular memory cell changes, the transistor is turned on causing a voltage on the precharge node to change. Hence, by such an approach, if during the sensing operation the voltage on the bit line associated with the particular memory cell does not change, the transistor forming the isolation logic will not turn on, and there will be no change in voltage at the precharge node, thereby indicating that the stored data state has a first data state, for example a logic one value. However, if during the sensing operation the voltage on the bit line associated with the particular memory cell starts to discharge, then this will turn the transistor of the isolation logic on, as a result of which the voltage on the precharge node will also discharge, thereby enabling the sense amp logic to detect as the stored data state of the particular memory cell a second data state, for example a logic zero level. Since the isolation logic isolates the precharge node from the capacitance of the multiplexer output, the detection of the stored data state by the sense amp logic can proceed much more quickly than would otherwise be the case, thereby improving the speed of the read operation.

In one particular embodiment, the precharge node of the sense amp logic is precharged to a higher voltage than the voltage to which the bit line associated with the particular memory cell is precharged, whereby if during the sensing operation the transistor is turned on, the voltage on the precharge node is caused to decrease towards the voltage of the bit line associated with the particular memory cell. By such an approach, if during the sensing operation the voltage on the bit line associated with a particular memory cell starts to discharge, this will cause the transistor to turn on, and then due to the difference in potential between the precharge node and the bit line associated with the particular memory cell, the voltage on the precharge node will start to drop quite rapidly towards the voltage of the bit line. This rapid decrease in voltage can be detected very quickly by the sense amp logic, thereby further increasing the speed of operation of the sensing operation.

Due to the time taken for a word line to be selected, and for the addressed memory cell's data state to be represented by the value of the voltage on the relevant bit line as routed through the multiplexer logic to the sense amp logic, it is important to allow sufficient time for the relevant signals to propagate through to the sense amp circuit before it can be ensured that the output from the sense amp logic reliably indicates the stored data state of the addressed memory cell. In one embodiment, the sense amp logic produces a sense amp output signal dependent on a voltage on the precharge node, and the memory device further comprises a buffer for receiving the sense amp output signal, on receipt of an output enable signal the buffer being operable to output the currently received sense amp output signal as a data output signal indicating the stored data state of the particular memory cell. Accordingly, in such embodiments, an output enable signal is generated at some point following the start of the sensing operation in order to indicate that the output from the sense amp logic can now be taken as indicating the stored data state of the particular memory cell.

In order to provide reliable reading of the memory cells, enough delay margin needs to be included between the time the sensing operation starts and the time the output enable signal is issued to ensure that the correct data state will always be indicated. However, in existing systems, it is difficult to calculate this delay margin accurately. Typically, the delay is introduced by the use of a series of gates, and often the variation in delay is larger than the variation in the time at which the sense amp logic will produce a reliable data state indication, and hence this serves to reduce the operating speed of the memory device.

In accordance with one embodiment of the present invention, the memory device further comprises self-timing path (STP) logic for producing the output enable signal, the STP logic being arranged based on signals produced by the control logic to replicate the timing of the precharge operation and the sensing operation, and to produce the output enable signal dependent on that replicated timing. Since the STP logic replicates the timing of the precharge operation and the sensing operation, it can produce an output enable signal at a time which much more accurately reflects the time at which the sense amp's output will indeed indicate the stored data state of the addressed memory cell, and hence reduces the delay margin needed to ensure correct operation. As a result, this further improves the performance of the read operation.

The STP logic may be arranged in a variety of ways. However, in one embodiment the STP logic comprises replica sense amp logic to replicate the timing of the sense amp logic; and a plurality of replica memory cells to replicate the timing of access to the particular memory cell of the memory array. By separately replicating the timing of the access to the particular memory cell and the timing of the sense amp logic, the STP logic can accurately determine a time at which the output enable signal can be issued to indicate that the currently buffered sense amp output is indicative of the stored data state of the particular memory cell being read.

The plurality of replica memory cells can be arranged in a variety of ways. However, in one embodiment the plurality of replica memory cells comprise: a row of replica memory cells connected to a replica word line which is selected based on a signal produced by the control logic; and a column of replica memory cells, one replica memory cell of which is connected to the replica word line. The number of replica memory cells provided in the row will in one embodiment be the same or nearly the same as the number of actual memory cells in a row of the memory array, and similarly the number of replica memory cells provided in the column will be the same or nearly the same as the number of actual memory cells in a column of the memory array. Within the column of replica memory cells, one of the replica memory cells is connected to the replica word line. In one embodiment, the other replica memory cells in the column have their gate connected to ground, and merely provide loading on the replica bit line equivalent to the loading that would be experienced on one of the actual bit lines in the memory array. Similarly, the replica memory cells in the row merely provide loading on the replica word line equivalent to the loading that would be experienced on one of the actual word lines in the memory array.

The decoder logic can take a variety of forms. However, in one embodiment, the decoder logic comprises first decoder logic operable on receipt of a signal from the control logic to select one of said word lines based on a number of most significant bits of said address; and second decoder logic for producing said multiplexer control signal based on a number of least significant bits of said address. In one embodiment, the second decoder logic will produce the multiplexer control signal before the first decoder logic selects one of the word lines, as this assists in ensuring that the bit line associated with the particular memory cell being addressed is precharged ahead of the word line being selected.

Whilst in one embodiment the memory device consists of a single memory array, in alternative embodiments more than one memory array may be provided. In particular, in one embodiment, the memory device further comprises: a further memory array having a plurality of memory cells, the further memory array having a plurality of further word lines and a plurality of further bit lines associated therewith via which the plurality of memory cells are accessed; further multiplexer logic having a plurality of inputs and an output, each input connected to one of said plurality of further bit lines, and said output being connected to one of said inputs dependent on a further multiplexer control signal; further isolation logic provided between said output of the further multiplexer logic and said precharge node of the sense amp logic to isolate said precharge node from the capacitance of said output of the further multiplexer logic during said sensing operation; the sense amp logic being shared between the memory array and the further memory array, and the control logic being operable to only enable at any one time one of the memory array and the further memory array; if the further memory array is enabled the decoder logic being responsive to the address to produce said further multiplexer control signal and to select one of said further word lines, whereby a particular memory cell in said further memory array identified by the address has its associated further bit line connected to said output of the further multiplexer logic; if the further memory array is enabled the control logic causing the precharge node of the sense amp and at least the further bit line associated with the particular memory cell to be precharged in said precharge operation prior to said sensing operation.

In accordance with such embodiments, the sense amp logic is shared between the memory array and the further memory array with the control logic selecting which memory array is enabled at any particular point in time. Each memory array has associated multiplexer logic and associated isolation logic. Since only one memory array is enabled at any particular point in time, in one embodiment the decoder logic and control logic are shared between the memory array and the further memory array. Such a design can be scaled to provide highly banked memory architectures, with each pair of memory banks being arranged as described above.

Viewed from a second aspect, the present invention provides a memory device comprising: a memory array having a plurality of memory cells; a plurality of word lines and a plurality of bit lines via which the plurality of memory cells are accessed; multiplexer logic having a plurality of inputs and an output, each input connected to one of said plurality of bit lines, and said output being connected to one of said inputs dependent on a multiplexer control signal; decoder logic, responsive to an address, for producing said multiplexer control signal and for selecting one of said word lines, whereby a particular memory cell in said memory array identified by the address has its associated bit line connected to said output of the multiplexer logic; sense amp logic coupled to said output of the multiplexer logic and having a precharge node used during a sensing operation to detect a stored data state of said particular memory cell, the sense amp logic producing a sense amp output signal dependent on a voltage on the precharge node; a buffer for receiving the sense amp output signal, on receipt of an output enable signal the buffer being operable to output the currently received sense amp output signal as a data output signal indicating the stored data state of said particular memory cell; control logic for initiating the sensing operation and for causing the precharge node of the sense amp and at least the bit line associated with the particular memory cell to be precharged in a precharge operation prior to said sensing operation; and self-timing path (STP) logic for producing the output enable signal, the STP logic being arranged based on signals produced by the control logic to replicate the timing of the precharge operation and the sensing operation, and to produce the output enable signal dependent on that replicated timing.

In accordance with the second aspect of the present invention, irrespective of whether isolation logic is provided within the memory device in accordance with the first aspect of the present invention, STP logic is provided within the memory device for producing an output enable signal used to indicate when the currently buffered sense amp output signal can be taken as indicating the stored data state of an addressed memory cell. The STP logic is arranged based on signals produced by the control logic to replicate the timing of the precharge operation and the sensing operation, and to produce the output enable signal dependent on that replicated timing. This provides a particularly accurate technique for determining the timing at which the output enable signal can be issued within a memory device that employs precharging techniques.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 2:
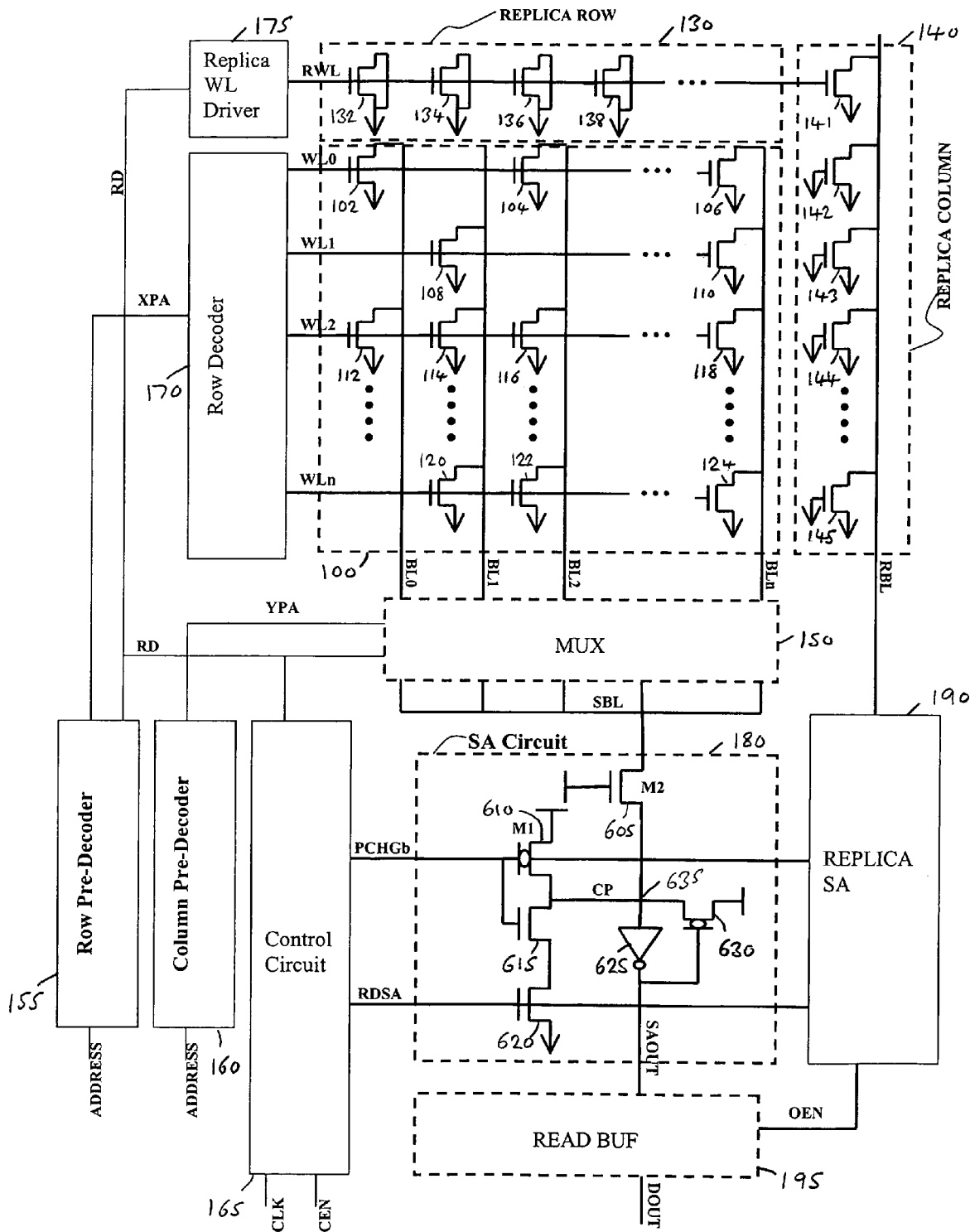
FIG. 2 is a block diagram schematically illustrating a memory device in accordance with an embodiment of the present invention.

FIG. 2 is a diagram schematically illustrating a memory device in accordance with one embodiment of the present invention. The memory device shown in FIG. 2 is a low power consumption semiconductor memory device and in one particular embodiment is a ROM memory device. The memory device illustrated in FIG. 2 has a memory array 100 consisting of a plurality of memory cells 102, 104, 106, . . . , 120, 122, 124. The memory cells are arranged into a plurality of rows and columns, with each row being connected to a word line WL0, WL1, etc, and each column being connected to an associated bit line BL0, BL1, etc. Each memory cell within the ROM device may be programmed with a logical one or a logical zero value. As shown in FIG. 2, each memory cell is associated with one word line and one bit line and hence if the associated word line is selected in order to turn on the memory cell, then the value stored in the memory cell can be detected by observing what happens to the voltage on the associated bit line.

It will be appreciated that memory devices are used to store blocks of data, for example data words, with each data word consisting of multiple bits, for example 32 bits. FIG. 2 illustrates the memory cells of the array used to store a single bit of each data word, and it will be appreciated that the circuitry shown in FIG. 2 will be replicated for each other bit of the data word. Hence, for a 32 bit data word, the circuitry in FIG. 2 may be replicated 32 times.

When it is desired to read a particular data value, an address for that data value will be issued, this address being received by the row pre-decoder 155 and the column pre-decoder 160. The row pre-decoder 155 produces a row pre-decoded address XPA which is routed to the row decoder 170, the row decoder determining from the XPA signal received which word line WL0, WL1, etc should be selected. Similarly, the column pre-decoder 160 produces a column pre-decoded address YPA which is routed to multiplexer logic 150. This YPA signal is used by the multiplexer logic 150 to determine which bit line BL0, BL1, etc should be connected to the multiplexer's output SBL. A sense amp (SA) circuit 180 is then connected to the SBL output of the multiplexer 150, the sense amp circuit 180 having a column precharge (CP) node 635 which is monitored in order to detect the data value stored in the addressed memory cell. The way in which this detection takes place will be discussed in more detail later.

The sense amp circuit 180 produces an output signal SAOUT which is routed to a read buffer 195. When the read buffer 195 receives a set output enable (OEN) signal, it then outputs the currently buffered SAOUT value as an indication of the data value stored in the addressed memory cell;

A control circuit 165 is provided which receives a clock signal CLK and a circuit enable signal CEN. Based thereon the control circuit generates a variety of signals which are used to control a precharge operation during which the bit line of the addressed memory cell is precharged to a precharged state and the CP node within the SA circuit is also precharged to a precharged state. In one embodiment, the CP node of the SA circuit 180 is precharged to $V_{DD}$, and due to the presence of the transistor 605, the mux output SBL and the connected bit line are precharged to $V_{DD}-V_{tn}$, where $V_{tn}$ is the threshold voltage of the transistor 605.

The transistor 605 forms isolation logic which isolates the capacitance of the multiplexer logic 150 from the precharge node CP of the SA circuit 180. The insertion of this transistor 605, which in one embodiment is a single NMOS transistor, between the mux output SBL and the CP node of the SA circuit does not slow down the precharge speed because the NMOS transistor size is large. During the subsequent sensing operation, the presence of the transistor 605 significantly improves the speed of the sensing operation, since the insertion of that transistor between the output SBL and the CP node significantly reduces the CP node parasitic capacitance. A further discussion of the operation of the SA circuit 180 will be provided later with reference to FIG. 8.

Given that the speed of operation of the SA circuit 180 is significantly improved through the presence of the transistor 605, the valid SAOUT signal can be output to the read buffer 195 significantly more quickly than would otherwise be possible. As discussed earlier, the read buffer is responsive to the OEN signal to output the currently buffered SAOUT signal as the output signal DOUT identifying the stored state of the addressed memory cell. Ideally, this OEN signal should be set as soon as the SAOUT signal becomes valid, i.e. as soon as that signal accurately identifies the stored state of the addressed memory cell. However, in typical prior art systems, it has been difficult to accurately identify such timing. In the system described in the earlier mentioned article by Hideyuki Kabuo et al., the external clock signal is delayed in order to latch the sense amplifier output into an output buffer. However, the delay amount is not decided precisely. Typically the delay is constituted by routing the signal through multiple gates in series. As a result, the delay variation is typically larger than the sense amplifier output delay variation, and this can significantly impact the speed of the ROM read operation.

The OEN signal needs to track the data path delay to ensure correct and fast operation. However, since the memory cells are made out of very small sized devices and are hence more vulnerable to process variations, the delay of the output enable signal does not track the normal data path well over all process and environmental conditions. Therefore, enough delay margin has to be provided to the output enable path to cover a worst case condition.

In accordance with one embodiment of the present invention, this delay margin is reduced markedly through the provision of a self-timing path (STP) which tracks very closely the path delay through the memory cell and sense amp circuit. As shown in FIG. 2, this technique uses a replica row 130 of memory cells 132, 134, 136, 138 which are connected to a replica word line RWL, along with a replica column 140 of memory cells 141, 142, 143, 144, 145 which are connected to a replica bit line RBL. The replica row 130 in one embodiment has the same number of memory cells as are provided within a row of the memory array 100. Similarly, the replica column 140 includes a number of memory cells corresponding to the number of memory cells connected to each bit line of the memory array 100. The replica column 140 additionally includes one memory cell 141 which is coupled to the replica word line RWL. All of the other memory cells 142, 143, 144, 145 have their gates connected to ground and merely serve to provide loading on the replica bit line RBL. With regard to the memory cell 141, when the replica word line RWL is enabled, transistor 141 turns on and pulls the replica bit line RBL down to ground potential. The transistors 132, 134, 136, 138 in the replica row 130 serve to provide loading on the replica word line equivalent to the loading on each word line in the memory array 100.

As shown in FIG. 2, a replica word line driver 175 is provided which receives as an input a read enable signal RD produced by the control circuit 165. Further details of the operation of the control circuit and the replica word line driver will be provided later.

As also shown in FIG. 2, a replica sense amp circuit 190 is provided which is connected to the replica bit line RBL, and also receives control signals from the control circuit 165. As will be discussed in more detail later, the replica sense amp circuit 190 serves to replicate the timing of the multiplexer 150 and the SA circuit 180.

As will be described in more detail later, when the row decoder 170 applies a voltage to a particular word line, the replica word line driver 175 also provides a voltage to the replica word line. If the addressed memory cell stores a logic one value, then the CP node 635 within the SA circuit 180 will remain at its precharged state. In contrast, if the addressed memory cell stores a logic zero value, then the associated bit line will start to discharge, which will cause the transistor 605 to turn on and thereby cause the CP node 635 to discharge. In either event, a replica column precharge node within the replica SA circuit 190 will discharge as a result of the voltage on the replica bit line RBL discharging following the turning on of transistor 141.

As a result, the provision of the replica row 130, the replica column 140 and the replica sense amp logic 190 provides a mechanism for accurately tracking the timing of access to the addressed memory cell, and the timing of the sense amp circuit 180 thereby reducing the delay margin that needs to be provided, and hence enabling a quicker generation of the output signal from the read buffer 195.

Figure 1:
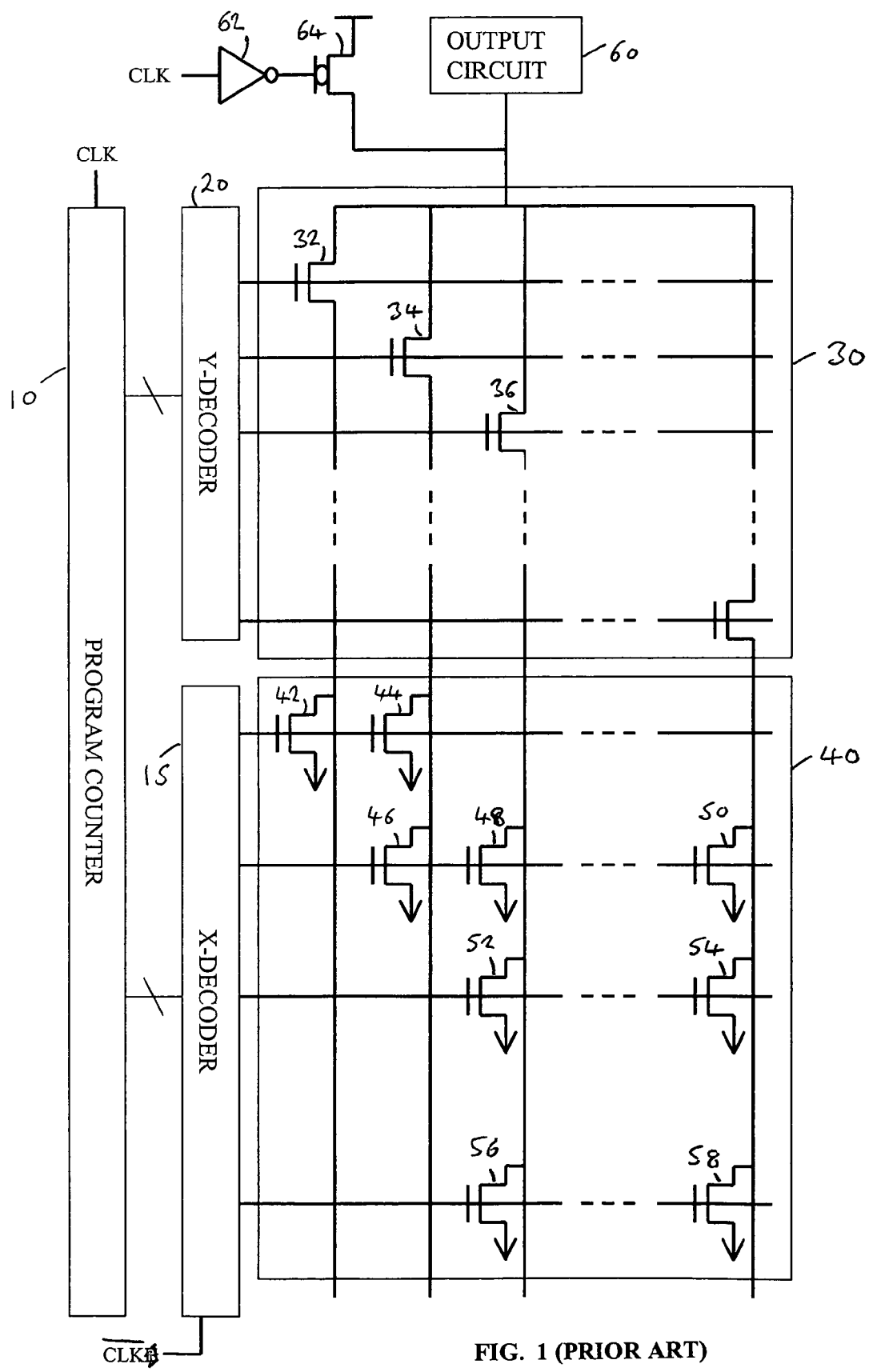
FIG. 1 is a block diagram schematically illustrating a prior art technique using selective precharging of bit lines.
Figure 3:
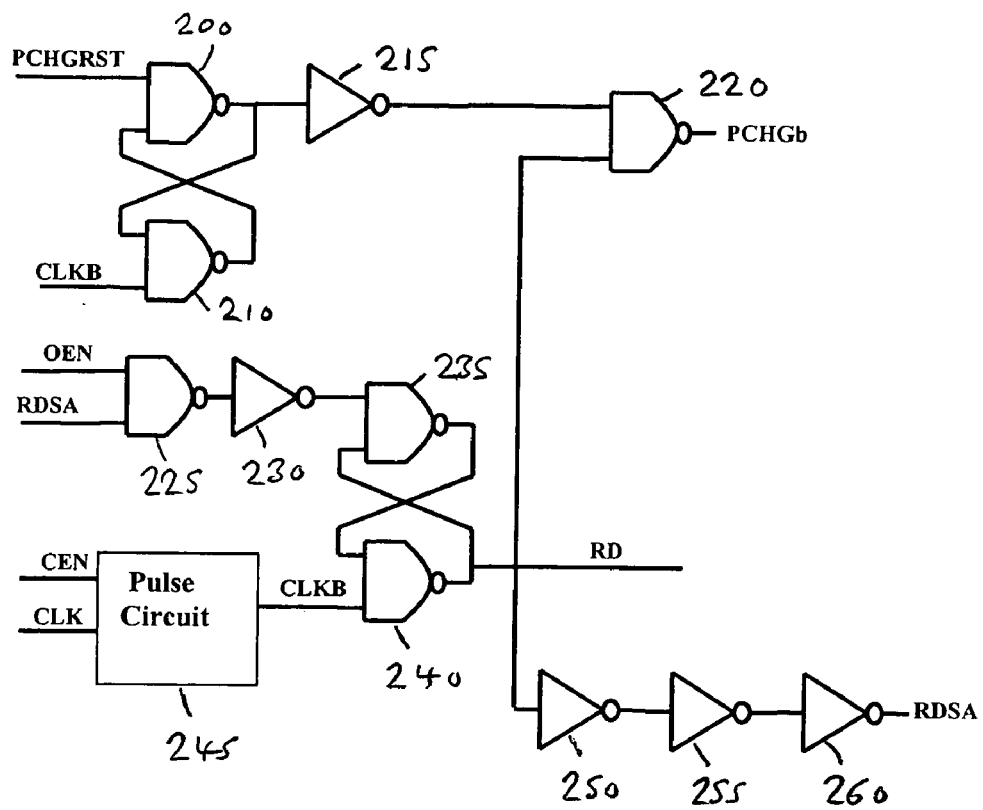
FIG. 3 is a diagram schematically illustrating the control circuit of FIG. 2 in accordance with one embodiment.

FIG. 3 is a diagram schematically illustrating the control circuit 165 of FIG. 1 in accordance with one embodiment. As can be seen from FIG. 3, the control circuit generates the signals RD, PCHGb and RDSA having CEN, CLK and OEN as inputs. When the clock signal is high and CEN is low for a data read operation, then the pulse circuit 245 produces a signal CLKB which via the NAND gates 235, 240 causes the signal RD to go high. As a result, following a delay introduced by the NAND gate 220, the signal PCHGb goes low, and the signal RDSA goes low following a delay introduced by the three invertors 250, 255, 260.

As will be described in more detail later, the replica sense amp logic 190 produces signals PCHGRST and OEN which are routed to NAND gates 200, 225, respectively. When the PCHGRST signal is set low, signals propagated via circuit elements 200, 210, 215, 220 cause the signal PCHGb to be reset to a high state (i.e. $V_{DD}$). When the OEN signal is reset to low at the end of the read cycle, the operation of the circuit element 225, 230, 235, 240 causes the signal RD to be reset to a low state, and the RDSA to be reset to a high state.

Figure 4:
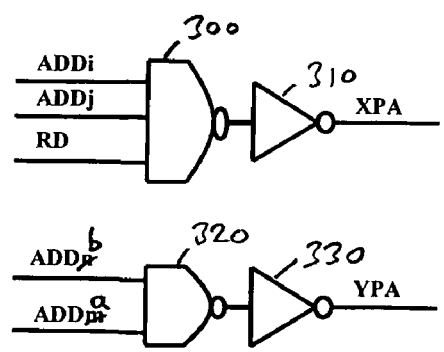
FIG. 4 is a diagram schematically illustrating the row pre-decoder and column pre-decoder of FIG. 2 in accordance with one embodiment of the present invention.

FIG. 4 schematically illustrates the row pre-decoder 155 and column pre-decoder 160 of FIG. 2. The row pre-decoder 155 consists of NAND gate 300 and inverter 310, the NAND gate 300 being arranged to receive a certain number of most significant bits of the address and the RD signal. Similarly, the column pre-decoder 160 consists of NAND gate 320 and inverter 330, the NAND gate 320 being able to receive a certain number of least significant bits of the address.

Figure 5:
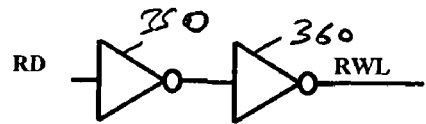
FIG. 5 is a diagram schematically illustrating the replica word line driver of FIG. 2 in accordance with one embodiment of the present invention.

FIG. 5 schematically illustrates the replica word line driver 175 of FIG. 2 in accordance with one embodiment. As can be seen from FIG. 5, the replica word line driver consists of a number of inverters 350, 360 which cause the replica word line signal RWL to be a delayed version of the RD signal received at the input of the replica word line driver 175. As a result, when the RD signal from the control circuit is set high, the replica word line driver generates a high voltage level on the replica word line after the delay introduced by the inverters 350, 360. At the end of the read cycle, when the RD signal then goes low, the replica word line voltage also goes to a low level.

Figure 6:
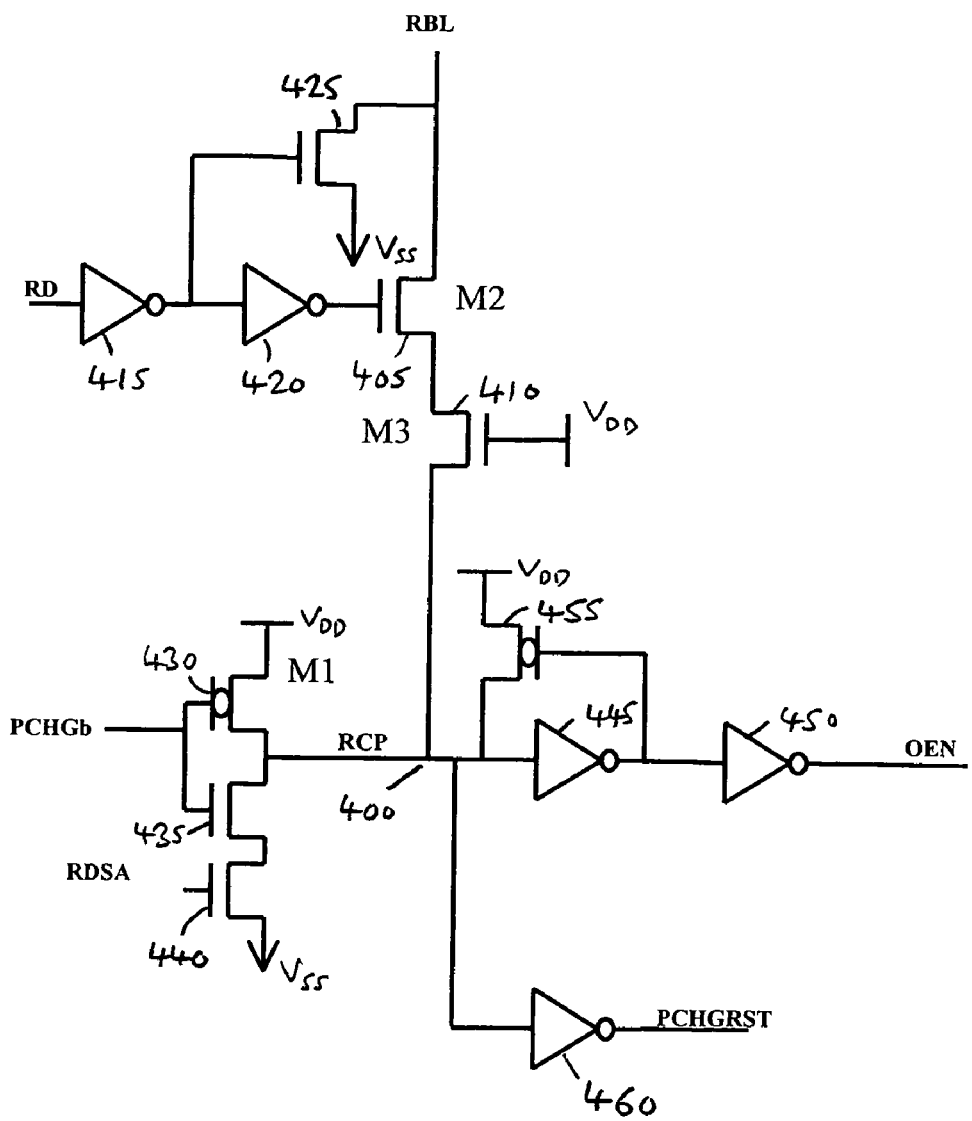
FIG. 6 is a diagram schematically illustrating the replica sense amp logic of FIG. 2 in accordance with one embodiment of the present invention.

FIG. 6 is a diagram schematically illustrating the replica sense amp logic 190 of FIG. 2 in accordance with one embodiment. The replica sense amp logic 190 receives the signals RD, PCHGb and RDSA produced by the control circuit discussed earlier with reference to FIG. 3. The replica sense amp logic 190 then generates the signals OEN and PCHGRST as outputs. When the signal RD goes to the high $V_{DD}$ state first and then the signal PCHGb goes to a low voltage state, the discharge NMOS transistor 425, whose drain is connected to the replica bit line RBL and whose gate is connected to the output of the inverter 415, is turned off and NMOS pass transistor 405, whose drain is connected to the replica bit line RBL, and whose source is connected to the NMOS transistor 410, is turned on due to the inverter 420 causing a $V_{DD}$ level voltage signal to be received at the gate of the transistor 405.

Given that the PCHGb signal goes low, this causes the transistor 430 to turn on and the transistor 435 to turn off, thereby allowing the RCP node 400 to be precharged to $V_{DD}$. The weak pull up transistor 455 serves to assist in holding the RCP node at the precharged state, once that state has been reached. Since the transistor 410 is permanently on and the transistor 405 is now on as discussed above, this causes the replica bit line RBL to be precharged to a voltage level $V_{DD}$-$V_{tn}$ through the two NMOS pass transistors 405, 410. Whilst one of the transistors 405, 410 is provided to replicate the timing of the isolation transistor 605 in SA circuit 180, the other of the two transistors is provided to replicate the timing of the multiplexer logic 150.

After the precharge operation is started on the RCP node and the replica bit line RBL, the signal PCHGRST goes to a low level as the RCP voltage rises, due to the presence of the inverter 460. At this point, the replica word line RWL is at the $V_{DD}$ level, given that RD is high. Therefore, the replica memory cell 141 is turned on.

The low state of the PCHGRST signal resets the PCHGb signal to $V_{DD}$ within the control circuit (as discussed earlier with reference to FIG. 3), which causes the precharge operation on the RCP node and on RBL to stop. Next, the RCP node starts being pulled low due to the replica memory cell 141 pulling the replica bit line RBL towards $V_{SS}$.

Once the voltage level on the RCP node 400 goes lower than a trip point of a detecting inverter 445, the detecting inverter output goes high, which results via inverter 450 in the output of a low OEN signal. The low going OEN signal is provided to the read buffer 195 as discussed earlier with reference to FIG. 2. At the end of the read cycle, the RD signal is reset to the low state by the low going OEN signal, and the RD signal is reset to the high state, as discussed earlier with reference to FIG. 3.

Figure 7:
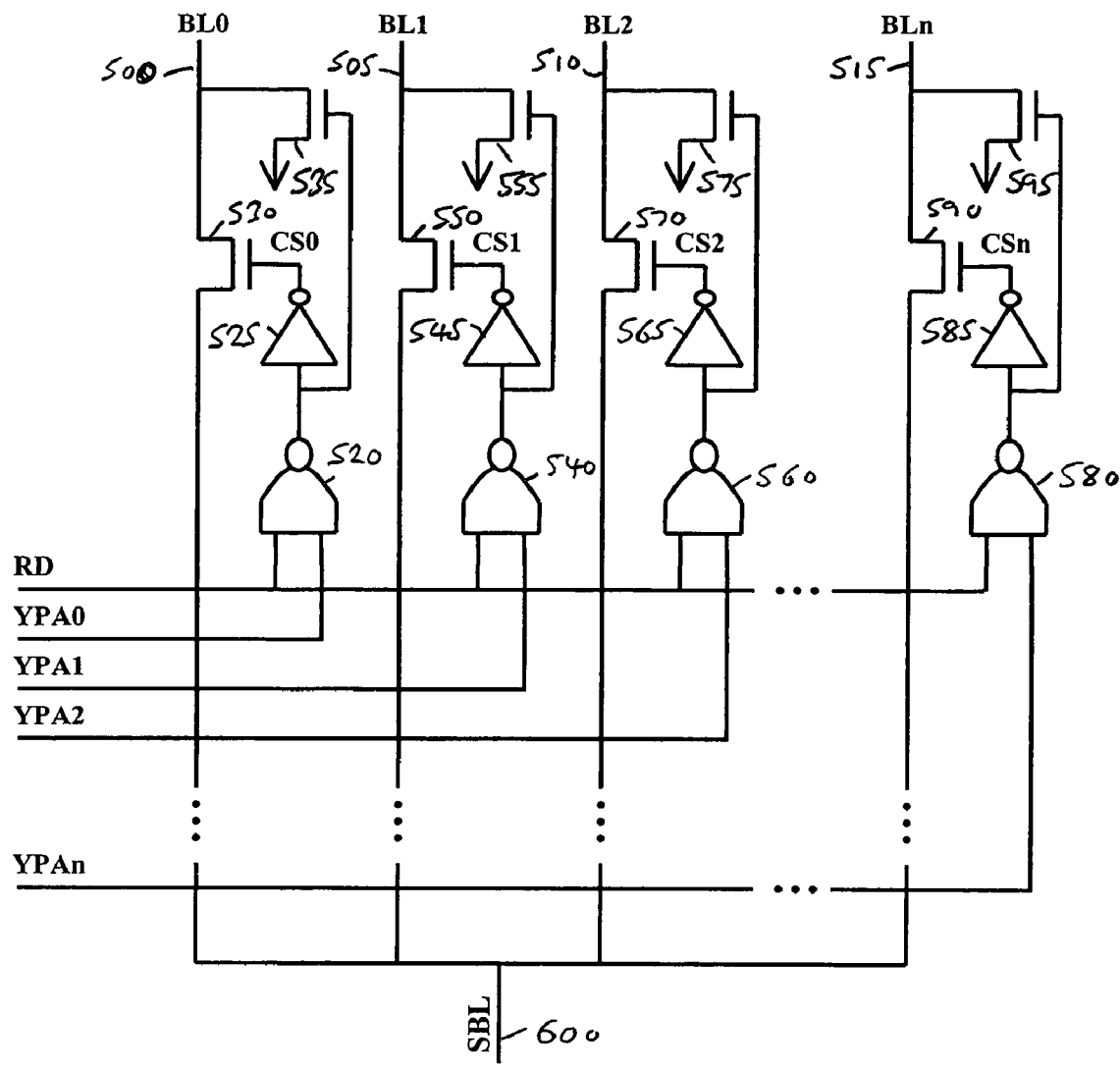
FIG. 7 is a diagram schematically illustrating the multiplexer logic of FIG. 2 in accordance with one embodiment of the present invention.

FIG. 7 is a diagram schematically illustrating the multiplexer 150 in FIG. 2 in accordance with one embodiment. The read only memory system includes one or more column multiplexers, and each multiplexer has a plurality of input terminals which are connected to the bit lines 500, 505, 510, 515. The output 600 of the multiplexer is selectively coupled to one of the bit lines dependent on the received column pre-decoded address YPA from the column pre-decoder 160. As shown in FIG. 7, a pre-discharge NMOS transistor 535, 555, 575, 595 is electrically connected to each bit line and is configured to discharge the bit lines to a low voltage level $V_{SS}$. The multiplexer circuit shown in FIG. 7 is configured to select only one of the bit lines provided as an input to the multiplexer circuit when one of the pre-decoded column addresses YPA and the read enable signal RD are enabled. Each bit line is connected to the output SBL through a pass gate 530, 550, 570, 590, and as mentioned earlier each bit line is connected to a discharge device 535, 555, 575, 595 that serves to pull the associated bit line to the low voltage level $V_{SS}$ when either the enable signal RD or the column pre-decoded address signal is low.

One high signal among the plurality of column pre-decoded addresses YPA0, YPA1, etc, along with the high going RD signal, serves to turn on the associated transmission gate through the relevant NAND gates 520, 540, 560, 580 and associated inverters 525, 545, 565, 585, thereby coupling one of the bit lines to the output SBL whilst turning off the associated discharge transistor. Hence, as a particular example, if YPA0 is high whilst the signal RD is high, then the NAND gate 520 will produce a logic zero level which will turn off the discharge transistor 535. Further, due to the inverter 525, the pass transistor 530 will be turned on, connecting bit line BL0 500 to the output SBL 600.

Figure 8:
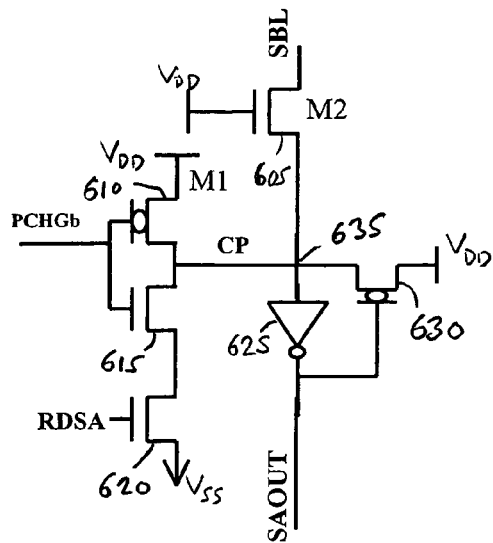
FIG. 8 is a diagram schematically illustrating the sense amp circuit of FIG. 2 in accordance with one embodiment of the present invention.

FIG. 8 schematically illustrates the sense amp circuit 180 of FIG. 2 in accordance with one embodiment of the present invention. The SA circuit 180 is configured to sense an electrical state of the CP node 635 which is connected to the output SBL of the column multiplexer circuit 150 through the NMOS pass transistor 605. As discussed earlier, the transistor 605 serves to isolate the CP node 635 from the capacitance of the multiplexer 150. As discussed earlier with reference to FIG. 3, when the RD signal goes high, the signals PCHGb and RDSA go low. As a result, the transistors 615 and 620 are turned off, and the transistor 610 is turned on, thereby precharging the CP node 635 to $V_{DD}$. As a result, the output of the multiplexer SBL and the connected input bit line to the multiplexer 150 are precharged to a voltage $V_{DD}-V_{tn}$, where $V_{tn}$ is the threshold voltage of the transistor 605. After the CP node 635 is precharged to the $V_{DD}$ level, the precharge signal PCHGb is reset to the $V_{DD}$ level following issuance of the precharge reset signal PCHGRST at a low voltage level by the replica sense amp circuit 190 following the detection of the high level of the RCP node 400 in the replica sense amp circuit (as discussed earlier with reference to FIG. 6). As a result both the CP node 635 and the RCP node 400 are at that point no longer connected to the source voltage supply.

The voltage of the CP node 635 is detected within the sense amp circuit, in order to read the logic value of the addressed memory cell. As discussed earlier, when the relevant word line is selected, the voltage level of the associated bit line stays high if the stored bit is a logic one value, as a result of which the transistor 605 will remain turned off and the CP node 635 will stay at the high voltage level. However, if the addressed memory cell stores a logic zero value, then the voltage level of the associated bit line will start to discharge, which will cause the transistor 605 to turn on due to the potential difference between the gate and the drain then exceeding the threshold voltage. As a result, the voltage level on the CP node 635 will rapidly decrease towards the voltage level on the SBL output of the multiplexer which will cause the inverter 625 to output a logic one value, thereby turning off the transistor 630. The transistor 630 is merely a weak pull up transistor to keep the CP node 635 in the precharged state in the event that the SBL line does not discharge.

Once the read operation is finished, the control circuit resets the RD signal to a low level following receipt of the low level OEN signal, and as a result the RDSA signal is reset to a high level, which then causes the transistor 620 to be turned on to pre-discharge the CP node 635 to the low voltage level.

Figure 9:
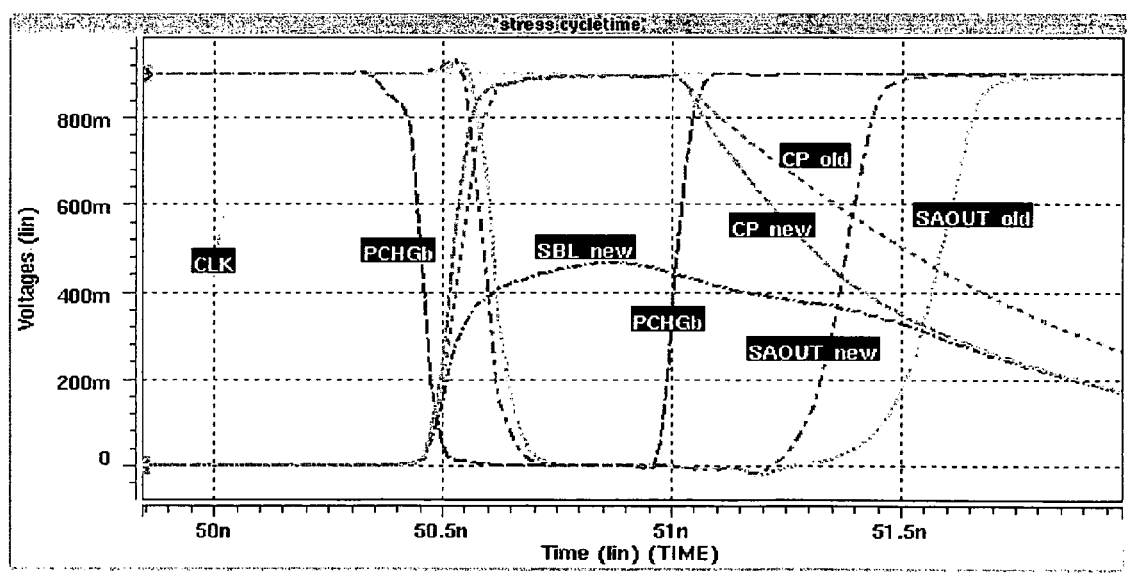
FIG. 9 is a chart showing a simulation result achieved when employing a memory device according to one embodiment of the present invention.

FIG. 9 is a chart showing the simulation results achieved when adopting a memory device structure such as that discussed earlier with reference to FIG. 2. It also shows the simulation results that would be achieved when using a system such as that taught by the earlier-mentioned article by Hideyuki Kabuo et al. In FIG. 9, the simulation waveforms achieved when using an embodiment of the present invention is represented by the term "new" and the simulation waveforms achieved when using the prior art technique described in the Hideyuki Kabuo et al. article is represented by the term "old". As can be seen from FIG. 9, when the precharge phase ends as a result of the PCHGb signal going high, the CP node 635 rapidly discharges towards the voltage level of the SBL node assuming the memory cell being addressed stores a logic zero value, the speed of operation not being impacted by the capacitance of the multiplexer 150. This causes the SAOUT signal to transition to the logic one level relatively quickly when compared with the prior art technique. Hence, it can be seen that the sensing speed is significantly improved when using above described embodiment of the present invention.

Figure 10:
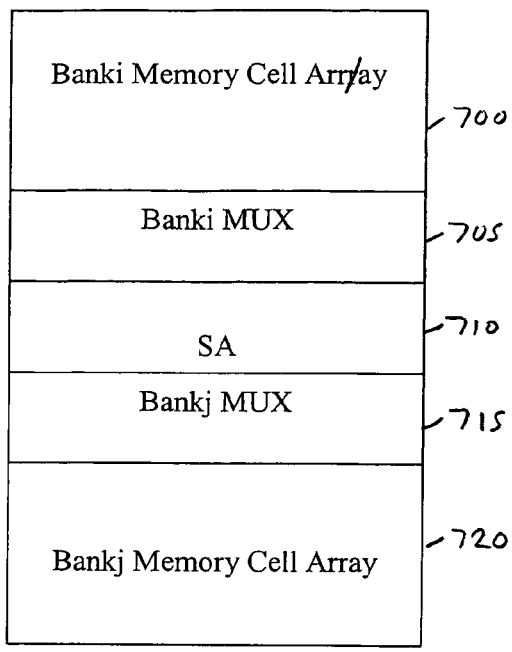
FIG. 10 is a diagram schematically illustrating a second embodiment of the present invention.
Figure 11:
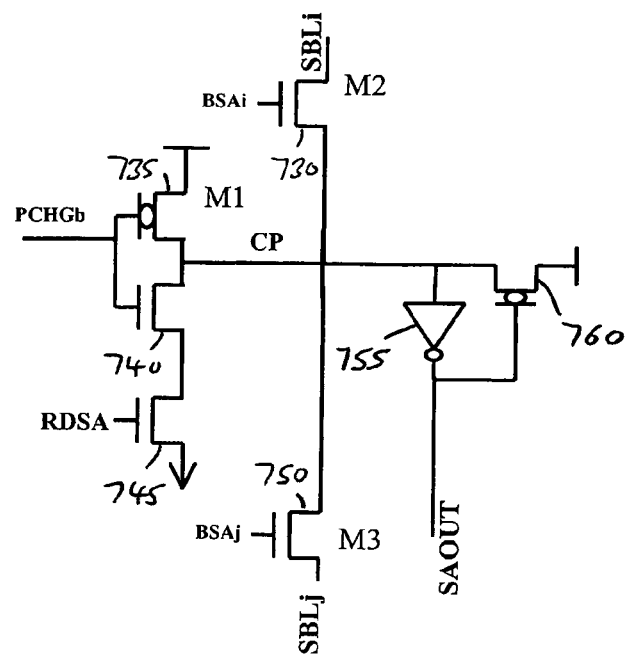
FIG. 11 is a diagram schematically illustrating the sense amp logic of FIG. 10.

FIG. 10 is a diagram schematically illustrating an alternative embodiment of the present invention. FIG. 10 illustrates a situation where two banks of memory cells are provided which share a sense amp circuit. In particular, a first memory cell array 700 has associated multiplexer logic 705 whilst a further memory cell array 720 has associated multiplexer logic 715. The multiplexer logic 705 and 715 operate in the same manner as discussed earlier with reference to the multiplexer 150 of FIG. 2. Both memory arrays then share the sense amp circuit 710, one embodiment of which is schematically illustrated in FIG. 11. As will be appreciated from a comparison of FIG. 11 with the earlier described FIG. 8, the logic elements 730, 735, 740, 745, 755, 760 operate in the same manner as the logic elements 605, 610, 615, 620, 625, 630 described earlier with reference to FIG. 8. However, whilst the transistor 605 in FIG. 8 was permanently connected to the supply voltage $V_{DD}$, it will be noted that the transistor 730 is instead connected to a bank select signal $BSA_i$. This signal is set to a high voltage level if the memory array 700 is enabled.

In addition, the sense amp circuit 710 includes a corresponding transistor 750 which is connected to the control signal $BSA_j$. $BSA_j$ is set to a high voltage level if instead the memory array 720 is enabled. The transistors 730, 750 hence serve the same purpose as the transistor 605 of FIG. 8, namely to isolate the CP node from the capacitance of the multiplexer associated with the memory array that is currently enabled. Control logic is provided which ensures that at any point in time only one of the memory arrays 700, 720 is enabled.

Figure 12:
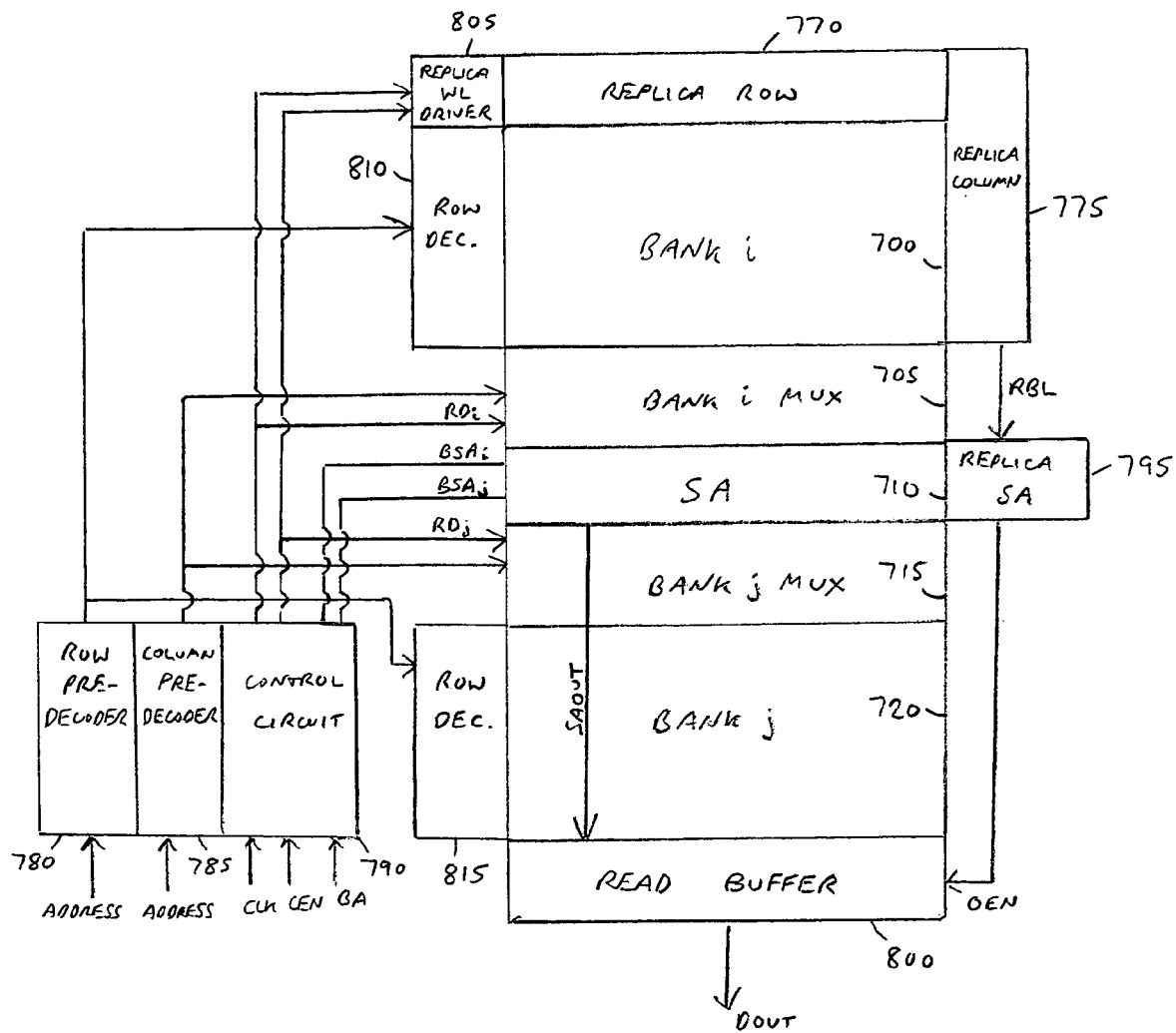
FIG. 12 is a more detailed diagram of the second embodiment illustrated schematically with reference to FIG. 10.

FIG. 12 is a diagram showing in more detail the memory device in accordance with the second embodiment of the present invention. As can be seen from FIG. 12, the row pre-decoder logic 780 and column pre-decode logic 785, along with control logic 790, can be shared between both memory arrays. Similarly, only a single self-timed path is required formed by the replica row 770, the replica column 775, and the replica sense amp logic 795, the replica row being driven by the replica word line driver 805.

Each memory array 700, 720 is provided with its own associated row decoder 810, 815. These row decoders 810, 815 operate in the same manner as the row decoder 170 discussed earlier with reference to FIG. 2, and similarly the row pre-decoder 780 and column pre-decoder 785 operate in the same manner as the row pre-decoder 155 and column pre-decoder 160 of FIG. 2.

The control logic 790 operates in a similar manner to that discussed earlier with reference to the control circuit 165 of FIG. 2, but now additionally receives a bank select signal BA. Based on the bank select signal, the control logic produces the earlier mentioned $BSA_i$ and $BSA_j$ signals routed to the sense amp logic 710 discussed earlier with reference to FIG. 11. In addition, the control logic produces separate $RD_i$ and $RD_j$ signals which are routed to the respective multiplexer logic 705, 715. Further, the replica word line driver 805 is driven by the relevant $RD_i$ or $RD_j$ signal dependent on which bank is currently enabled. Irrespective of which memory array is enabled, the SAOUT signal from the sense amp logic 710 is routed to the read buffer logic 800 which receives the OEN signal from the replica sense amp logic 795. The replica row 770, replica column 775 and replica sense amp logic 795 are constructed in the same manner as the earlier described replica row 130, replica column 140 and replica sense amp logic 190 of FIG. 2.

Figure 13:
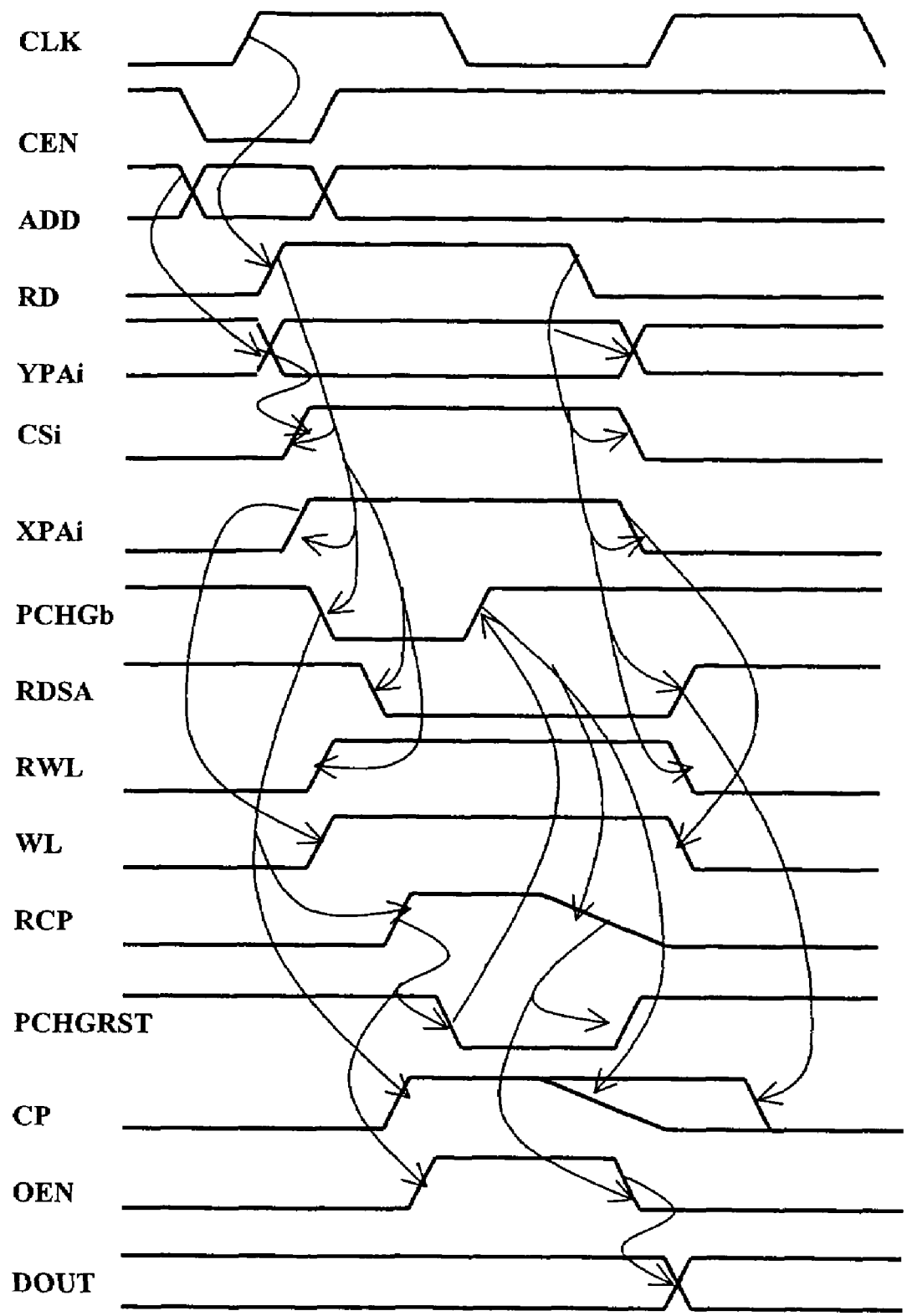
FIG. 13 is a timing diagram illustrating the operation of the memory device illustrated in FIG. 2 in accordance with one embodiment of the present invention.

FIG. 13 is a timing diagram used to illustrate the operation of the memory device of FIG. 2 in accordance with one embodiment. When the memory device is selected, the CEN signal goes to a low voltage level, and the CEN signal goes to a high voltage level during the time period when the memory device is not selected. If the clock signal goes high whilst the CEN signal is low in order to read out the data from the memory device, this causes the RD signal to go high. The column pre-decoder 160 generates a pre-decoded column address YPA. On the rising of the RD signal, column address decoding is started by inputting both RD and the column pre-decoded address YPA to the multiplexer 150. A column select output CS of n column address outputs is selected and goes to a high voltage level.

Due to the high level of the signal RD, the signal PCHGb goes to a low voltage level and the column precharge PMOS transistor 610 in the sense amp circuit 180 and the column precharge PMOS transistor 430 in the replica sense amp circuit 190 are turned on. Accordingly, the CP node in the sense amp circuit 180 and the RCP node in the replica sense amp circuit 190 are precharged to the source voltage $V_{DD}$, i.e. to a high voltage level. As a result, the mux output SBL is precharged to the level $V_{DD}$-$V_{tn}$. Further, the replica bit line RBL in the replica sense amp logic 190 is precharged to the voltage level $V_{DD}$-$V_{tn}$ due to it being connected to the RCP node through the devices 405 and 410.

Further, due to the high level of the RD signal, the row pre-decoder 155 generates a pre-decoded row address XPA, and row address decoding is started by inputting the XPA signal to the row decoder 170. A word line WL out of the n word lines is selected and the voltage on that word line becomes high. Further, the voltage on the replica word line RWL also goes high due to the high level of the signal RD.

Meanwhile, due to the rising voltage of the RCP node, the precharge reset signal PCHGRST goes to a low voltage level. As a result, this causes the control circuit to change the PCHGb signal to a high voltage level, thereby causing the precharge PMOS transistors 610 and 430 within the sense amp circuit 180 and the replica sense amp circuit 190, respectively, to be turned off.

The sensing operation in both the SA circuit 180 and the replica SA circuit 190 is then started after the PCHGb signal goes to a high voltage level. The RCP node starts to be pulled down to a low voltage level via the replica memory bit cell 141 of FIG. 2. However, the CP node of the SA circuit 180 is only pulled to a low voltage level if the memory cell data is a logic zero level, but instead is kept at a high voltage level if the memory cell data is at a logic one level. The CP node voltage level is sensed by the sensing inverter 625 and output as the SAOUT signal from the sense amp circuit 180.

Once the RCP node voltage level is dropped lower than the inverter trip point, the output enable signal OEN goes low. The going low of the OEN signal is then used to turn on a pass gate within the read buffer 195, thereby enabling the valid SAOUT signal to be output as the DOUT signal indicating the stored data state of the addressed memory cell.

When the OEN signal goes low, the NAND flip flop circuit 235, 240 within the control circuit 165 causes the RD signal to be reset to a low voltage level, and accordingly all other signals are reset to the same states as present in standby mode.

From the above described embodiments of the present invention, it will be realised that such embodiments enable a significant improvement in the performance of a memory device that uses precharge techniques to reduce power consumption. Isolation logic is used to isolate the precharge node of the sense amp circuit from the capacitance of the multiplexer logic connected to the bit lines, thereby improving the speed of operation of the sense amp circuit. Further, an accurate self-timing path is provided which can accurately track the delays within the memory array and the sense amp circuit. This hence enables the delay margin used when generating the read enable signal to be substantially reduced, thereby further improving speed of operation.

It will be appreciated that whilst the use of the self-timing path can further enhance the performance achieved when also using the isolation logic discussed above, performance improvements can still be achieved when using the self-timing path logic in memory devices that do not use such isolation logic.

Although a particular embodiment of the invention has been described herein, it will be apparent that the invention is not limited thereto, and that many modifications and additions may be made within the scope of the invention.

For example, various combinations of the features of the following dependent claims could be made with the features of the independent claims without departing from the scope of the present invention.

We claim:

1. A memory device comprising:
   a memory array having a plurality of memory cells;
   a plurality of word lines and a plurality of bit lines via which the plurality of memory cells are accessed;
   multiplexer logic having a plurality of inputs and an output, each input connected to one of said plurality of bit lines, and said output being connected to one of said inputs dependent on a multiplexer control signal;
   decoder logic, responsive to an address, for producing said multiplexer control signal and for selecting one of said word lines, whereby a particular memory cell in said memory array identified by the address has its associated bit line connected to said output of the multiplexer logic;
   sense amp logic coupled to said output of the multiplexer logic and having a precharge node used during a sensing operation to detect a stored data state of said particular memory cell;
   control logic for initiating the sensing operation and for causing the precharge node of the sense amp and at least the bit line associated with the particular memory cell to be precharged in a precharge operation prior to said sensing operation; and
   isolation logic provided between said output of the multiplexer logic and said precharge node of the sense amp logic to isolate said precharge node from the capacitance of said output of the multiplexer logic during said sensing operation.

2. A memory device as claimed in claim 1, wherein:
   said isolation logic comprises a transistor, a voltage applied to the gate of the transistor being such that, when the bit line associated with the particular memory cell reaches its precharged state, the transistor turns off;
   during the sensing operation, if a voltage on the bit line associated with the particular memory cell changes, the transistor is turned on causing a voltage on the precharge node to change.

3. A memory device as claimed in claim 2, wherein the precharge node of the sense amp logic is precharged to a higher voltage than the voltage to which the bit line associated with the particular memory cell is precharged, whereby if during the sensing operation the transistor is turned on, the voltage on the precharge node is caused to decrease towards the voltage of the bit line associated with the particular memory cell.

4. A memory device as claimed in claim 1, wherein the sense amp logic produces a sense amp output signal dependent on a voltage on the precharge node, and the memory device further comprises a buffer for receiving the sense amp output signal, on receipt of an output enable signal the buffer being operable to output the currently received sense amp output signal as a data output signal indicating the stored data state of said particular memory cell.

5. A memory device as claimed in claim 4, further comprising self-timing path (STP) logic for producing the output enable signal, the STP logic being arranged based on signals produced by the control logic to replicate the timing of the precharge operation and the sensing operation, and to produce the output enable signal dependent on that replicated timing.

6. A memory device as claimed in claim 5, wherein the STP logic comprises:
   replica sense amp logic to replicate the timing of the sense amp logic; and
   a plurality of replica memory cells to replicate the timing of access to the particular memory cell of the memory array.

7. A memory device as claimed in claim 6, wherein the plurality of replica memory cells comprise:
   a row of replica memory cells connected to a replica word line which is selected based on a signal produced by the control logic; and
   a column of replica memory cells, one replica memory cell of which is connected to the replica word line.

8. A memory device as claimed in claim 1, wherein the decoder logic comprises:
   first decoder logic operable on receipt of a signal from the control logic to select one of said word lines based on a number of most significant bits of said address; and
   second decoder logic for producing said multiplexer control signal based on a number of least significant bits of said address.

9. A memory device as claimed in claim 1, further comprising:
   a further memory array having a plurality of memory cells, the further memory array having a plurality of further word lines and a plurality of further bit lines associated therewith via which the plurality of memory cells are accessed;
   further multiplexer logic having a plurality of inputs and an output, each input connected to one of said plurality of further bit lines, and said output being connected to one of said inputs dependent on a further multiplexer control signal;
   further isolation logic provided between said output of the further multiplexer logic and said precharge node of the sense amp logic to isolate said precharge node from the capacitance of said output of the further multiplexer logic during said sensing operation;
   the sense amp logic being shared between the memory array and the further memory array, and the control logic being operable to only enable at any one time one of the memory array and the further memory array;
   if the further memory array is enabled the decoder logic being responsive to the address to produce said further multiplexer control signal and to select one of said further word lines, whereby a particular memory cell in said further memory array identified by the address has its associated further bit line connected to said output of the further multiplexer logic;
   if the further memory array is enabled the control logic causing the precharge node of the sense amp and at least the further bit line associated with the particular memory cell to be precharged in said precharge operation prior to said sensing operation.

10. A memory device comprising:
    a memory array having a plurality of memory cells;
    a plurality of word lines and a plurality of bit lines via which the plurality of memory cells are accessed;
    multiplexer logic having a plurality of inputs and an output, each input connected to one of said plurality of bit lines, and said output being connected to one of said inputs dependent on a multiplexer control signal;
    decoder logic, responsive to an address, for producing said multiplexer control signal and for selecting one of said word lines, whereby a particular memory cell in said memory array identified by the address has its associated bit line connected to said output of the multiplexer logic;

sense amp logic coupled to said output of the multiplexer logic and having a precharge node used during a sensing operation to detect a stored data state of said particular memory cell, the sense amp logic producing a sense amp output signal dependent on a voltage on the precharge node;

a buffer for receiving the sense amp output signal, on receipt of an output enable signal the buffer being operable to output the currently received sense amp output signal as a data output signal indicating the stored data state of said particular memory cell;

control logic for initiating the sensing operation and for causing the precharge node of the sense amp and at least the bit line associated with the particular memory cell to be precharged in a precharge operation prior to said sensing operation; and self-timing path (STP) logic for producing the output enable signal, the STP logic being arranged based on signals produced by the control logic to replicate the timing of the precharge operation and the sensing operation, and to produce the output enable signal dependent on that replicated timing.

* * * * *